(12) United States Patent
Furukawa et al.

(10) Patent No.: US 8,223,178 B2
(45) Date of Patent: Jul. 17, 2012

(54) METHOD FOR DRIVING LIGHT-EMITTING PANEL

(75) Inventors: Keiichi Furukawa, Hachioji (JP); Yoshiyuki Suzuri, Hino (JP)

(73) Assignee: Konica Minolta Holdings, Inc., Tokyo (JP)

( * ) Notice: Subject to any disclaimer, the term of this patent is extended or adjusted under 35 U.S.C. 154(b) by 1053 days.

(21) Appl. No.: 11/815,306

(22) PCT Filed: Dec. 28, 2005

(86) PCT No.: PCT/JP2005/024021
§ 371 (c)(1),
(2), (4) Date: Aug. 1, 2007

(87) PCT Pub. No.: WO2006/082691
PCT Pub. Date: Aug. 10, 2006

(65) Prior Publication Data
US 2009/0040241 A1    Feb. 12, 2009

(30) Foreign Application Priority Data
Feb. 4, 2005   (JP) .................................. 2005-028670

(51) Int. Cl.
*G09G 5/00* (2006.01)

(52) U.S. Cl. .......... 345/691; 345/204; 345/690; 345/77; 345/82; 313/463

(58) Field of Classification Search .................. 345/690, 345/204, 76, 77, 81, 11, 207, 82–84, 102; 313/504, 463; 315/169.3
See application file for complete search history.

(56) References Cited

U.S. PATENT DOCUMENTS

| | | | | |
|---|---|---|---|---|
| 4,938,574 A | * | 7/1990 | Kaneko et al. | 345/97 |
| 7,417,782 B2 | * | 8/2008 | Hagood et al. | 359/290 |
| 2002/0084993 A1 | * | 7/2002 | Taneya et al. | 345/204 |
| 2003/0137499 A1 | * | 7/2003 | Iisaka | 345/204 |
| 2004/0214099 A1 | * | 10/2004 | Matsumoto | 430/24 |

FOREIGN PATENT DOCUMENTS

| | | |
|---|---|---|
| JP | 63-138691 A | 6/1988 |
| JP | 10-247401 A | 9/1998 |
| JP | 11-183901 A | 7/1999 |
| JP | 2000-029432 A | 1/2000 |
| JP | 2000-075836 A | 3/2000 |
| JP | 2001-257080 A | 9/2001 |
| JP | 2000-331781 A | 11/2001 |
| JP | 2001-313171 A | 11/2001 |
| JP | 2003-173880 A | 6/2003 |
| JP | 2003-229263 A | 8/2003 |

* cited by examiner

*Primary Examiner* — Lun-Yi Lao
*Assistant Examiner* — Olga Merkoulova
(74) *Attorney, Agent, or Firm* — Holtz, Holtz, Goodman & Chick P.C.

(57) ABSTRACT

The method for driving a light-emitting panel provides a method for driving a light-emitting panel such that, even if there is a defect at a certain place of the light-emitting surface, the whole surface is not turned off and the function as a lighting apparatus or a backlight of or the electronic information device can be maintained by means that only one area including the defect is turned off and the other areas are turned on. The method for driving a light-emitting panel is characterized in that the light-emitting surface is divided into a plurality of areas and each of the areas emits light by time sharing.

6 Claims, 6 Drawing Sheets

FIG. 1

WHOLE SURFACE EMISSION

FIG. 2 (A)  NO DEFECT: WHOLE SURFACE EMISSION

FIG. 2 (B)  DEFECT: WHOLE SURFACE TURNED OFF

FIG. 3

WHOLE SURFACE EMISSION

FIG. 6 (A) NO DEFECT: WHOLE SURFACE EMISSION

FIG. 6 (B) DEFECT: 3/4 EMISSION, 1 PLACE TURNED OFF, 3 PLACES TURNED ON

FIG. 7 (LIGHT EMISSION CHARACTERISTIC OF ORGANIC EL ELEMENT)

METHOD FOR DRIVING LIGHT-EMITTING PANEL

This application is a U.S. National Phase Application under 35 USC 371 of International Application PCT/JP2005/024021 filed Dec. 28, 2005.

TECHNICAL FIELD

The present invention relates to a method for driving a light-emitting panel composed of an organic electroluminescent element (may be called an organic EL element), used for a backlight or a lighting apparatus.

BACKGROUND ART

Figure 1:
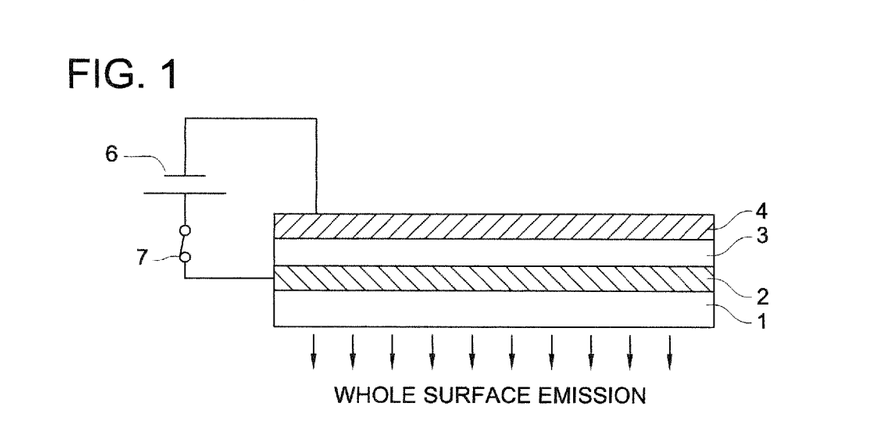
FIG. 1 is a schematic block diagram of the organic EL element used for a lighting apparatus and a backlight.

In recent years, a light-emitting panel composed of an organic EL element has been used as a lighting apparatus or a backlight of a liquid crystal display screen of an electronic information device. FIG. 1 shows a schematic constitution of an organic EL element used for a lighting apparatus or a backlight. In FIG. 1, a first electrode (hereinafter, referred to as an anode) 2 composed of a transparent electrode is formed on the top of a transparent substrate 1, and an organic layer 3 containing a luminescent compound is formed on the top of the anode 2. Furthermore, on the top of the organic layer 3, a second electrode (hereinafter, referred to as a cathode) 4 is formed. To the anode 2 and cathode 4, a light emission driving power source 6 is connected through a switch 7. When the switch 7 is turned on, electrons and positive holes are injected and recombined in the organic layer 3, thus excitons are generated. By use of emission of light (fluorescence, phosphorescence) when the excitons are deactivated, the organic layer 3 is permitted to emit light on the whole surface and it can be used as a lighting apparatus or a backlight. At this time, light can be emitted at a light emission driving voltage of several V to several tens V. Furthermore, the organic EL element has a wide view angle and a high visibility because it is a self-emission type, and the organic EL element also provides space saving because it is a film-type complete solid element. From these characteristics, the organic EL element is noticed as a light-emitting source (refer to Patent Document 1).

Further, for the purpose of lengthening the life span as a backlight, when the voltage of a battery power source drops, a method for emitting light from the half area is designed (refer to Patent Document 2).

Patent Document 1: Unexamined Japanese Patent Application No. 10-247401
Patent Document 2: Unexamined Japanese Patent Application No. 11-183901

DISCLOSURE OF THE INVENTION

Problems to be Solved by the Invention

Figure 2:
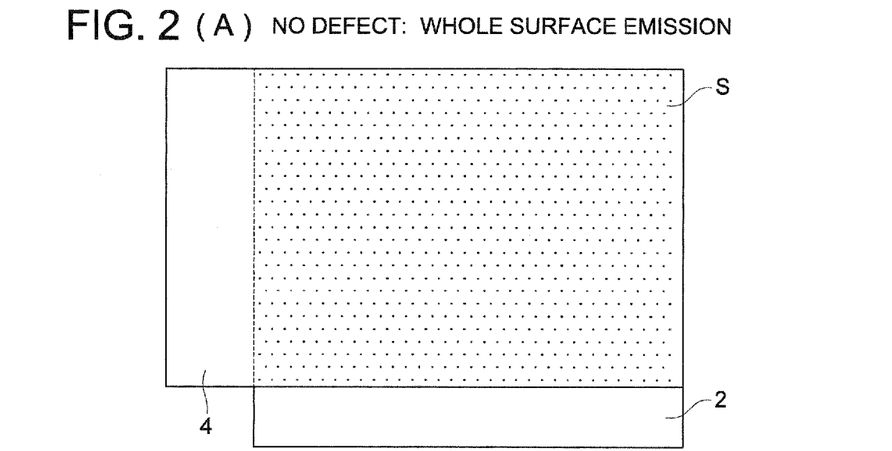
FIGS. 2(A) and 2(B) are drawings schematically showing the light-emitting state of the organic EL element due to existence of a defect.

However, when preparing the organic EL element, a defective portion such that foreign substances enter between the electrodes or irregularities of film thickness are caused may be included. When a voltage is applied between the electrodes of an organic EL element having such a defect, a problem arises that a current leaks through the defective portion and the whole light-emitting surface is turned off. FIG. 2(A) schematically shows the state that there is no defect T and a light-emitting surface S emits light all over the surface. Further, FIG. 2(B) schematically shows the state that there is the defect T and the light-emitting surface S is turned off all over the surface. If a leak is observed by an initial check, the organic EL element is not shipped as a product. Though after shipment, a leakage current in the defective portion increases slowly, and after use for a given period, the whole surface may be turned off suddenly, and a problem arises that the lighting apparatus and electronic information device cannot be used at all.

For such a problem, the present invention is intended to provide a light-emitting panel, even if there is a defect at a certain place of the light-emitting surface, that only one area including the defect is turned off and the other areas are turned on, thus the whole surface is not turned off, though the luminance lowers, and the function as a lighting apparatus or a backlight of or the electronic information device can be maintained.

Means to Solve the Problems

The present inventor pursued earnest studies, thereby could solve the aforementioned problem by use of any of the constitutions described below.

The method for driving a light-emitting panel of Item 1 is a method for driving a light-emitting panel formed by layering a first electrode, one or more of organic layers comprising a light-emitting layer, and a second electrode on a substrate, which comprises making a light-emitting surface of the light-emitting panel emit light by applying a voltage between the first electrode and the second electrode. In the method, the light-emitting surface is divided into a plurality of areas, and the plurality of areas are emitted by time sharing.

The method for driving a light-emitting panel of Item 2 is a method for driving a light-emitting panel according to Item 1 in which the light-emitting surface is divided into a plurality of areas by arranging the first electrode and the second electrode so as to intersect in a shape of grid.

The method for driving a light-emitting panel of Item 3 is a method for driving a light-emitting panel according to Item 1 or 2 in which the light-emitting surface is divided into 16 or more areas.

The method for driving a light-emitting panel of Item 4 is a method for driving a light-emitting panel according to Item 2 or 3 in which a voltage is applied to the first electrode and the second electrode so as to make a plurality of light-emitting surfaces which at least do not neighbor to each other of the light-emitting surface divided into the plurality of areas emit light at a same time.

The method for driving a light-emitting panel Item 5 is a method for driving a light-emitting panel according to Item 4 in which the plurality of light-emitting surfaces which do not neighbor to each other are alternate light-emitting surfaces.

Effect of the Invention

According to the method for driving a light-emitting panel of Item 1, the light-emitting surface is divided into a plurality of areas and the respective areas sequentially emit light by time sharing, so that even if a defect of a current leak is caused in one area, the other areas emit light. Thus, the light of the whole surface will not be turned off and the function as a light-emitting panel can be maintained.

Further, according to the method for driving a light-emitting panel of Item 2, in the method for driving a light-emitting panel according to Item 1, the light-emitting surface is divided into a plurality of areas by arranging the anode and cathode so as to intersect each other in a shape of grid. Thus, it enables to execute simple matrix drive, and it requires one power source. Therefore, even if a defect in which a current leaks is caused in an area, the light of the whole surface will not be turned off, and the function as a light-emitting panel can be maintained, and it can be manufactured at a low cost.

Further, according to the method for driving a light-emitting panel of Item 3, in the method for driving a light-emitting panel according to Item 1 or 2, the light-emitting surface is divided into 16 or more areas, so that even if a current leak is caused in an area and the light is turned off, it can be made inconspicuous.

Further, according to the method for driving a light-emitting panel of Item 4, in the method for driving a light-emitting panel according to Item 2 or 3, a voltage is applied to the anode and the cathode which are arranged with intersecting in a shape of grid so as to make a plurality of light-emitting surfaces which at least do not neighbor to each other of the light-emitting surface divided into the plurality of areas emit light at a same time. It reduces the number of time divisions comparing to the number of electrode divisions. Therefore, even if a current leak is caused in an area and the light is turned off, the brightness will not be unbalanced. Further, since the number of time shares is reduced, there is no need to increase greatly the luminance of the organic EL element in each area, thus the life span of the light-emitting panel can be lengthened.

Further, according to the method for driving a light-emitting panel of Item 5, in the method for driving a light-emitting panel according to Item 4, the plurality of light-emitting surfaces which do not neighbor to each other are alternate light-emitting surfaces. Therefore, it does not occur unbalanced brightness even if a current leak is caused in an area, and it enlarges the life span of the light-emitting panel because there is no need to increase greatly the luminance of the organic EL element.

BEST MODE FOR CARRYING OUT THE INVENTION

The preferred embodiments of the method for driving a light-emitting panel relating to the present invention will be described below with reference to the accompanying drawings.

Figure 3:
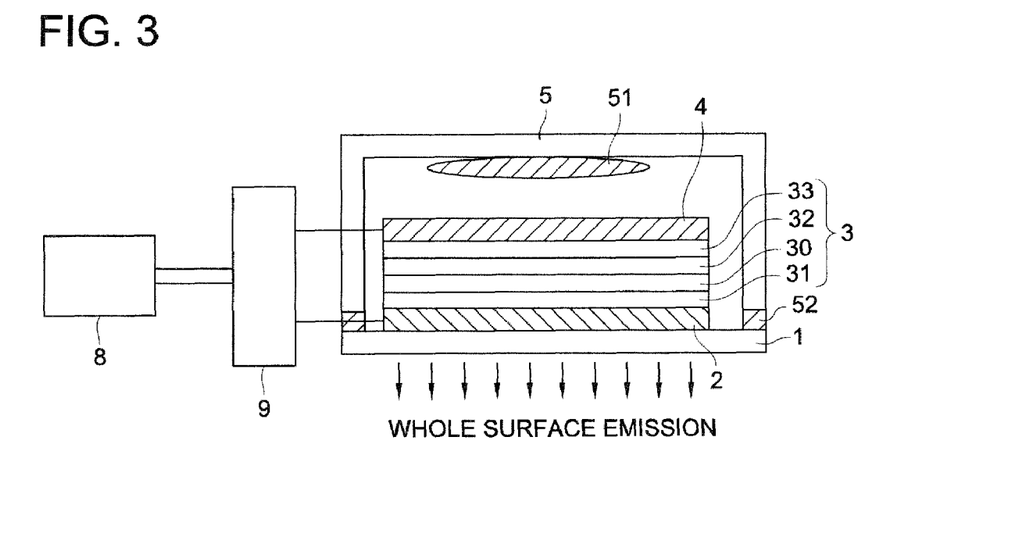
FIG. 3 is a schematic cross sectional view of the light-emitting panel using the organic EL element relating to the present invention.

The cross sectional view of the light-emitting panel using the organic EL element relating to the present invention is shown in FIG. 3. A transparent anode 2 is formed on the top of a transparent substrate 1, and a positive-hole transport layer 31 is formed on the top of the anode 2. Furthermore, on the top of the positive-hole transport layer 31, a light-emitting layer 30 is formed, and on the top thereof, a positive-hole inhibition layer 32 is formed. On the top of the positive-hole inhibition layer 32, an electron transport layer 33 is formed, and furthermore, on the top thereof, a cathode 4 is formed, thus the organic EL element is structured. The organic EL element is sealed by a sealing can 5 with an adhesive 52, thus the light-emitting panel is structured. To the inner surface of the sealing can 5, a desiccant 51 is attached. The anode 2 and cathode 4 are connected to a power unit 8 through a control IC 9.

Figure 4:
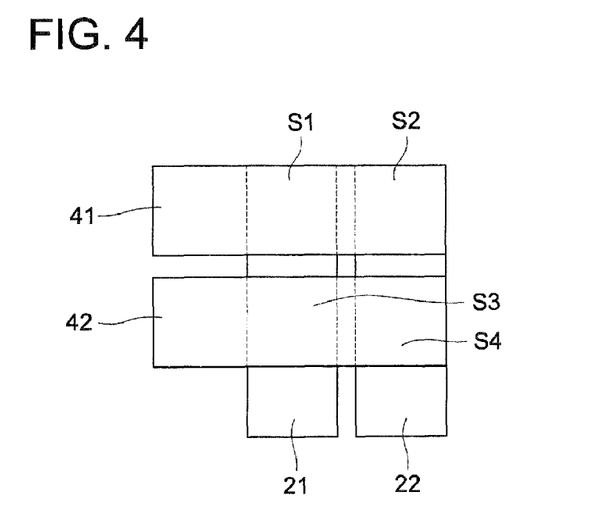
FIG. 4 is a drawing schematically showing the light-emitting surface when the anode and cathode of the organic EL element relating to the present invention are respectively divided into two parts.

FIG. 4 shows a schematic diagram when the anode 2 and cathode 4 are respectively divided into two parts and the light-emitting surface is divided into four parts S1, S2, S3, and S4. The method for driving a light-emitting panel relating to the present invention drives the four divided areas of the light-emitting surfaces S1, S2, S3, and S4 by four time divisions.

Figure 5A:
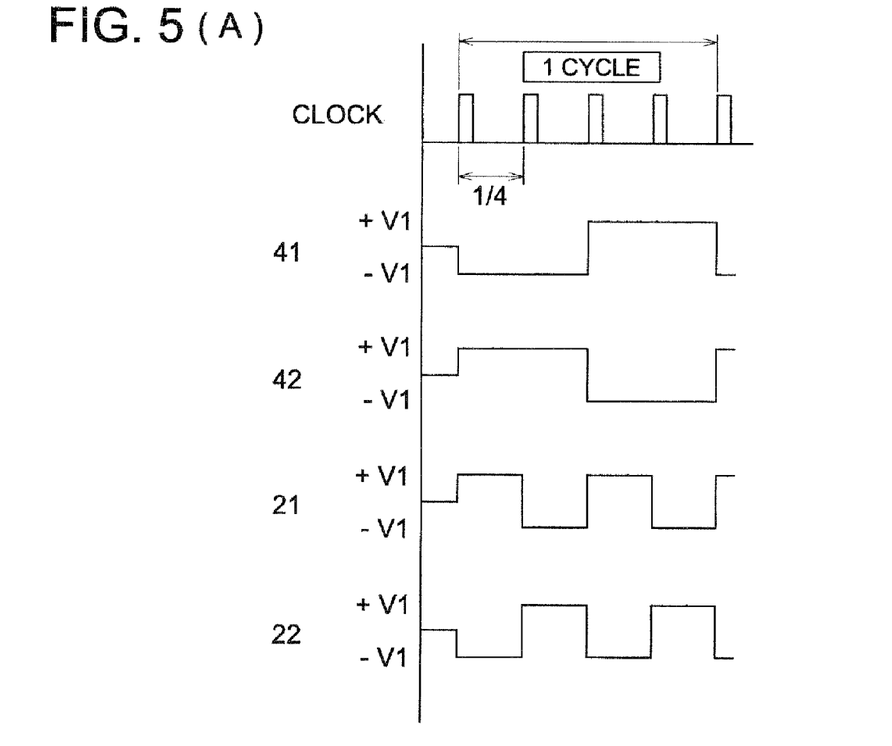
FIGS. 5(A) and 5(B) are timing charts of the voltage and potential applied to the anode and cathode of the organic EL element relating to the present invention.
Figure 5B:
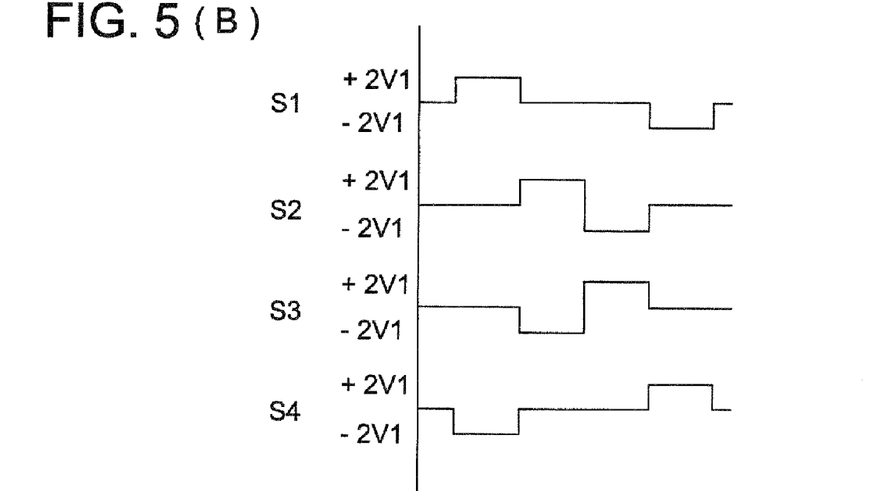
Figure 6A:
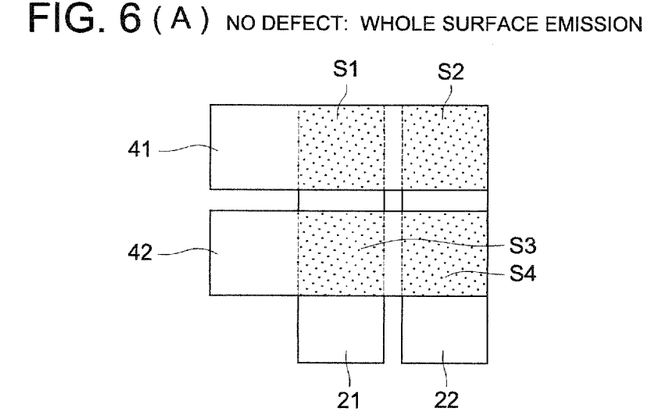
FIGS. 6(A) and 6(B) are drawings schematically showing the light-emitting state when the light-emitting surface of the organic EL element relating to the present invention is divided.
Figure 6B:
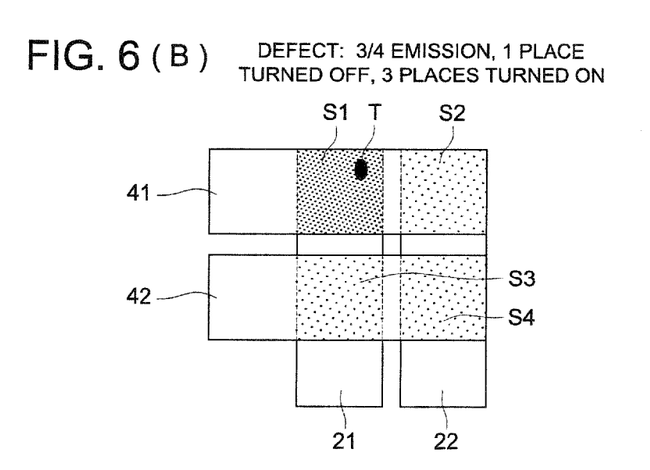

FIG. 5(A) shows a timing chart of the potential (+V1, −V1) applied to each electrode and FIG. 5(B) shows a timing chart of the voltage (+2V1, −2V1) applied between the anodes 21 and 22 and the cathodes 41 and 42 of each of the light-emitting surfaces S1, S2, S3, and S4. The case that there is no defect T in the light-emitting state during one cycle is shown in FIG. 6(A) and the case that there is the defect T in the light-emitting state during one cycle is shown in FIG. 6(B). As mentioned above, conventionally, the light on the whole surface is turned off when there is the defect T as shown in FIG. 2(B), though the ¾ area can emit light when the light-emitting surface is divided and each light-emitting surface is driven by time sharing.

The manufacturing method for the light-emitting panel relating to the present invention will be described bellow.

As a transparent substrate 1 of the present invention, a glass substrate is used. However, glass is not limitedly used for it and any transparent and insulating material can be used. On the substrate, a transparent conductive film is formed as an anode 2, and then the anode 2 is divided by patterning it as an anode 21 and an anode 22. The thickness of the anode 2 is preferably 50 nm to 300 nm. Any material of the anode 2, if it is transparent and conductive and can be generally used for the organic EL element, can be used. For example, ITO (indium tin oxide) or IZO (indium zinc oxide) can be used.

The positive-hole transport layer 31 has a function for transporting positive holes from the anode 2 to the light-emitting layer 30. As a positive-hole transport material of the positive-hole transport layer 31, any material which is generally used for the organic EL element, can be used. For example, triazole derivative, oxadiazole derivative, imidazole derivative, and aromatic tertiary amine compound can be used. The positive-hole transport material is formed into a thin film by the well-known method such as the vacuum deposition method, spin coating method, casting method, ink jet method, or LB method, thus the positive hole transport layer 31 can be formed on the tops of the anodes 21 and 22. The film thickness of the positive-hole transport layer 31, although not restricted particularly, is generally about 5 nm to 5000 nm.

The light-emitting layer 30 is composed at least one of organic compound or two or more kinds of organic compounds concerned in the light emitting function. The light-emitting layer 30 has an injection function of positive holes and electrons, a transport function of them, and a function for generating excitons by recombining positive holes and electrons. As a material of the light-emitting layer 30, generally, well-known materials used in the organic EL element can be used. For example, quinolinorato complex is known. Concretely, tris(8-quinolinorato)aluminum, bis(8-quinolinorato)magnesium, bis(benzo{f}-8-quinolinorato)zinc, bis(2-methyl-8-quinolinorato)aluminum oxide, tris(8-quinolinorato)indium, tris(5-methyl-8-quinolinorato)aluminum, 8-quinolinorato lithium, tris(5-chloro-8-quinolinorato)gallium, bis(5-chloro-8-quinolinorato)calcium, 5,7-dichlor-8-quinolinorato aluminum, tris(5,7-dibromo-8-hydroxy quinolinorato)aluminum, and poly[zinc(II)-bis(8-hydroxy-5-quinolinyl)methane may be cited. The film thickness of the light-emitting layer 30, although not restricted particularly, is generally about 5 nm to 5000 nm.

The positive hole inhibition layer 32 has a function transporting electrons and having an extremely low capacity of positive holes, and inhibits positive holes with transporting electrons, thereby can improve the recombination probability of electrons and positive holes.

As a positive-hole inhibition layer, for example, the positive-hole inhibition (hole block) layers described in the followings can be applied as a positive-hole inhibition layer relating to the present invention: Unexamined Japanese Patent Application Nos. 11-204258 and 11-204359; and "Organic EL Element and Industrialization Front Thereof (Nov. 30, 1998, NTS, Ltd.)", p 237.

The electron-transport layer 33 may have a function for transporting electrons injected from the cathodes 41 and 42 to the light-emitting layer 30, and the electron-transport material thereof can be generally selected optionally from the well-known materials used for the organic EL element. For example, nitro substituted fluorene derivative, diphenyl quinone derivative, thiopyran dioxide derivative, aromatic tetracarbonic acid anhydride such as naphthalene and perylene, carbodiimide, fluorenylidene methane derivative, anthraquinone dimethane & anthrone derivative, and oxadiazole derivative may be cited. Furthermore, in the oxadiazole derivative aforementioned, thiadiazole derivative in which the oxygen atoms of the oxadiazole ring are replaced with sulfur atoms and quinoxaline derivative having the quinoxaline ring known as an electron absorption group can also be used as an electron transport material. The electron-transport layer 33 can be formed by forming the electron-transport material into a thin film by the well-known method such as the vacuum deposition method, spin coating method, casting method, ink jet method, or LB method. The film thickness of the electron-transport layer 33, although not restricted particularly, is generally about 5 nm to 5000 nm.

For the cathodes 41 and 42, ordinary metals can be used. Particularly, from the viewpoint of conductivity and easy handling, one or more kinds of metals selected from Al, Ag, In, Ti, Cu, Au, Mg, Mo, W, and Pt are preferable. As a forming method for the electron injection electrodes 41 and 42, the sputtering method, resistance heating deposition method, and electron beam deposition method may be cited. By using a metal mask, divided electrodes can be formed. The film thickness of the cathodes 41 and 42, although not restricted particularly, is generally about 5 nm to 500 nm.

The organic EL element prepared in this way is adhered and sealed in the glass sealing can 5 with the ultraviolet curing adhesive 52 by using an ultraviolet lamp, thus the light-emitting panel relating to the present invention is prepared. At this time, it is preferable to adhere the organic EL element and sealing can 5 in a nitrogen atmosphere to prevent them from exposing to the air. The reason is to prevent the organic layer such the light-emitting layer from deterioration due to reaction to moisture in the air. Further, it is preferable to put the desiccant 51 in the sealing can 5. The reason is to trap the influence of an extremely small amount of moisture remaining in the sealing can and prevent deterioration of the organic layer.

Next, the method for driving a light-emitting panel relating to the present invention will be described.

The power unit 8 outputs the potentials +V1 and −V1 for driving the organic EL element. The power unit 8 applies the output voltages to the anodes 21 and 22 and cathodes 41 and 42 using the control IC 9 at the timing shown in FIG. 5(A). For the first ¼ time in one cycle, the potential −V1 is applied to the cathode 41 and anode 22 and the potential +V1 is applied to the cathode 42 and anode 21. For the next ¼ time, the potential −V1 is applied to the cathode 41 and anode 21 and the potential +V1 is applied to the cathode 42 and anode 22. Furthermore, for the next ¼ time, the potential −V1 is applied to the cathode 42 and anode 22 and the potential +V1 is applied to the cathode 41 and anode 21. For the last ¼ time in one cycle, the potential −V1 is applied to the cathode 42 and anode 21 and the potential +V1 is applied to the cathode 41 and anode 22. At this time, with respect to the voltages applied between the anodes 21 and 22 and the cathodes 41 and 42 of each of the light-emitting surfaces S1, S2, S3, and S4, as shown in FIG. 5(B), for the first ¼ time in one cycle, the voltage +2V1 is applied to S1, and no potential difference is generated in S2 and S3, and the voltage −2V1 is generated in S4. For the next ¼ time, the voltage +2V1 is applied to S2, and no potential difference is generated in S1 and S4, and the voltage −2V1 is generated in S3. Furthermore, for the next ¼ time, the voltage +2V1 is applied to S3, and no potential difference is generated in S1 and S4, and the voltage −2V1 is generated in S2. For the last ¼ time in one cycle, the voltage +2V1 is applied to S4, and no potential difference is generated in S2 and S3, and the voltage −2V1 is generated in S1.

Figure 7:
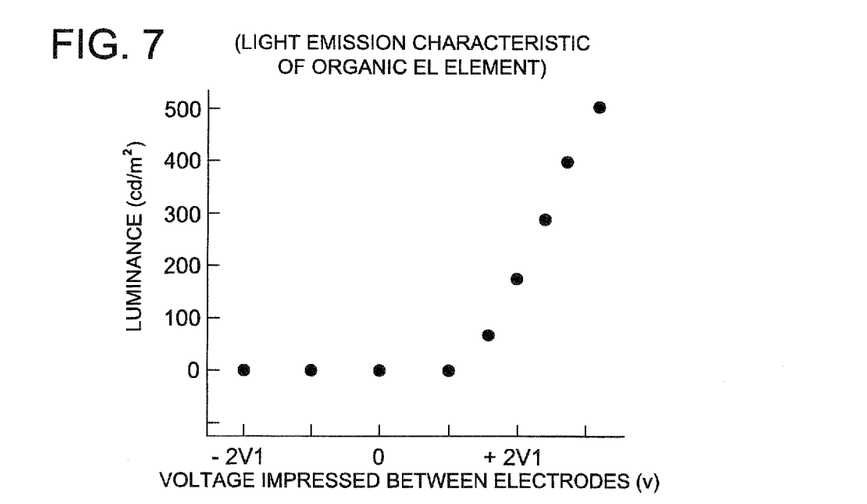
FIG. 7 is a drawing showing the light-emitting characteristic of the organic EL element relating to the present invention.

The light-emitting characteristic of the organic EL element relating to the present invention is shown in FIG. 7. FIG. 7 shows a high luminance at the voltage of +2V1, which shows that the element emits light. Therefore, when there exists no defect T occurring at time of preparation of the organic EL element, as shown in FIG. 6(A), each light-emitting surface emits light every ¼ time in the order of S1→S2→S3→S4 in one cycle. When the defect T occurs in the area of S1 at time of preparation of the organic EL element, as shown in FIG. 6(B), the voltage +2V1 is applied to S1, and simultaneously the current leaks through the defect T, and as a result, the potential difference disappears in the area of S1, thus the light thereof is turned off. However, for the next ¾ time, each light-emitting surface emits light in the order of S2→S3→S4. Therefore, even if the defect T exists, as a whole, the ¾ area emits light and the organic EL element can be used continuously as a light-emitting panel.

Although a driving frequency of a short time is satisfactorily inconspicuous, the driving frequency in this case is preferably 1 Hz to 1 kHz. When it is lower than 1 Hz, flickering of emitted light is felt and when it is higher than 1 kHz, the burden imposed on the organic EL element and driving circuit is increased.

In the above description, the example that the light-emitting surface of the light-emitting panel using the organic EL element of the present invention is divided into four parts and the ¼ time sharing drive is executed is indicated, though the number of divisions and the time sharing method are not limited to them. When the number of divisions of the light-emitting surface, although depending on the area of the light-emitting surface, is large, the leaking surface emitting no light is preferably inconspicuous. However, when it is excessively large, if the time sharing drive is executed for the number of divisions, the light emitting time in one area is shortened and it becomes considerably dark unless the luminance is increased. When the luminance is increased, it becomes bright, though the life span of the organic EL element is shortened. Therefore, it has been found that a method for increasing the number of divisions of the light-emitting surface and driving the light-emitting panel by the number of time divisions smaller than the number of divisions of the light-emitting surface is more effective. Further, it has been found that at this time, when the light-emitting surface is divided into 16 or more parts, the leaking light-emitting surface is almost inconspicuous.

Figure 8:
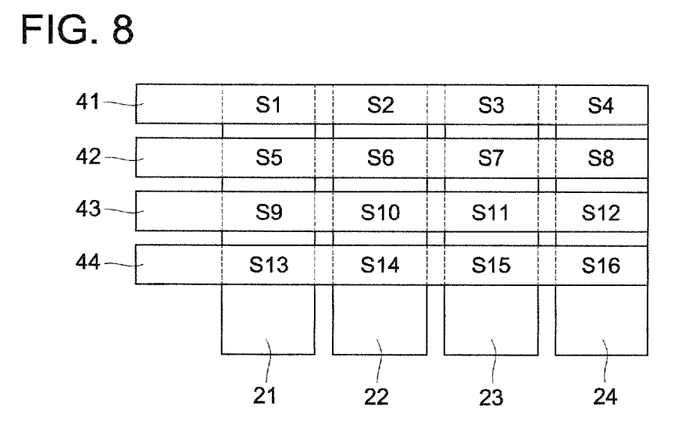
FIG. 8 is a drawing schematically showing the state of the light-emitting panel relating to the present invention which is divided into 16 parts.
Figure 9:
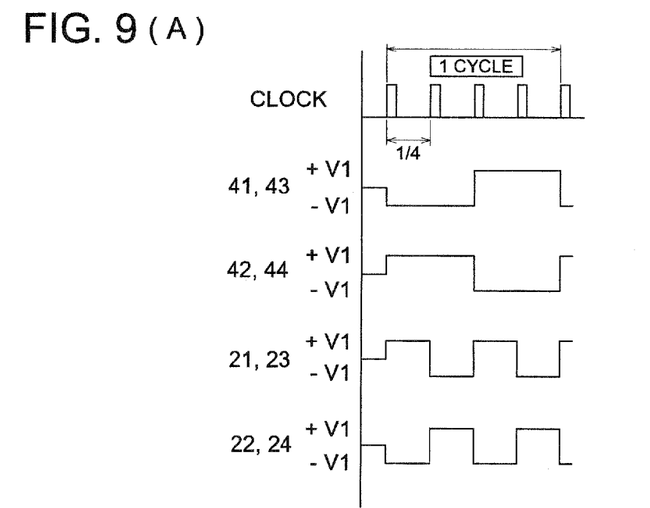
FIGS. 9(A) and 9(B) are timing charts of the voltage and potential applied to the anode and cathode of the organic EL element relating to the present invention.
Figure 10:
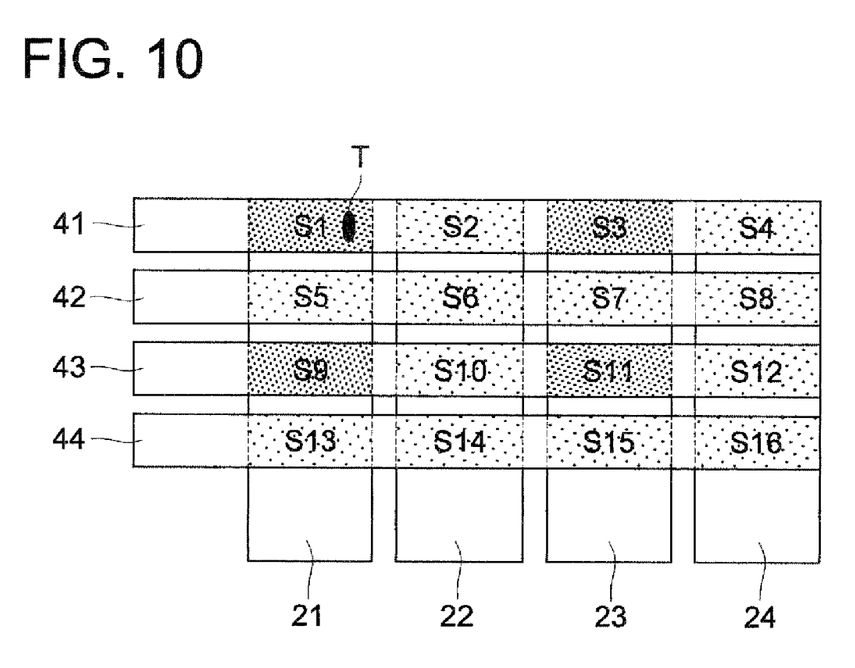
FIG. 10 is a drawing schematically showing the light-emitting state when the light-emitting surface of the organic EL element relating to the present invention is divided.

The drawing that the light-emitting panel relating to the present invention is divided into 16 parts is shown in FIG. 8. Further, as a driving method for the applied voltages to the anodes 21, 22, 23, and 24 and the cathodes 41, 42, 43, and 44, a timing chart of ¼ time-sharing drive is shown in FIG. 9(A). The state of the voltages applied to the light-emitting surfaces S1 to S16 at this time is as shown in FIG. 9(B), so that the light-emitting surfaces are as shown in FIG. 10. The drawing shows that the light-emitting surfaces S1, S3, S9, and S11 not applied with the voltages for light emission due to the defect T are in the off state. Therefore, viewed from the whole area, the ¼ area emits light every ¼ time, and the luminance is the same as that when the preshown area is divided into four parts, though the off areas are split, so that it is found that the unbalanced brightness is more inconspicuous. Although a driving frequency of a short time is satisfactorily inconspicuous, the driving frequency at this time is preferably 1 Hz to 1 kHz.

In the embodiments relating to the present invention, the cases that the light-emitting surface of the light-emitting panel is divided into four parts and sixteen parts are indicated, though the number of divisions is not limited to them. It can be selected variously depending on the area of the light-emitting surface and necessary brightness. Further, as a driving method, four-time sharing drives are indicated, though the number of divisions is not limited to it. Furthermore, as timing, the intervals are shown almost equal, though it is possible to shorten the voltage applying time to the anodes and cathodes in the area including the defect T by detecting the voltage or current or skip it. By doing this, the power consumption can be suppressed and the burden on the power source can be reduced.

EXAMPLES

Hereinafter, the present invention will be explained by referring to the embodiments, though the present invention is not limited to them.

Example 1

As an anode, a substrate (NA-45 by NH Technoglass, Corp.) prepared by forming a film of ITO with a thickness of 150 nm on glass of 75 mm×75 mm was patterned in an electrode shape by a general photolithographic method. Using the photomask in the anode shape shown in FIG. 4, the anodes 21 and 22 each having an electrode width of 18 mm and a space of 2 mm between the electrodes were formed. Thereafter, the transparent support substrate equipped with the transparent ITO electrodes (anodes) was ultrasonic-cleaned with isopropyl alcohol, is dried by drying nitrogen gas, and is UV ozone-cleaned for 5 minutes.

The transparent support substrate was fixed to the substrate holder of a commercially sold vacuum metallizing apparatus and on the other hand, α-NPD, CBP, Ir-1, BCP, and were respectively put into five molybdenum resistance heating boats and the boats are attached to the vacuum metallizing apparatus.

[Chemical 1]

α-NPD

CBP

Ir-1

BCP

Alq₃

Next, a vacuum bath was decompressed to 4×10 Pa, and then the heating boat including α-NPD was supplied with an electric current to be heated, and α-NPD was deposited on the transparent support substrate at a deposition rate of 0.1 nm/s to 0.2 nm/s so as to form a film with a thickness of 50 nm, thus a positive hole transport layer is formed.

Furthermore, the heating boats including CBP and Ir-1 were respectively supplied independently with an electric current, and the deposition rates of CBP and Ir-1 which are light emitting materials were adjusted so as to be 100:7. Then, the light emitting materials were deposited so as to form a film with a thickness of 30 nm, thus a light-emitting layer was formed.

Then, the heating boat including BCP was supplied with an electric current to be heated, and a positive-hole inhibition layer with a thickness of 10 nm was formed at a deposition rate of 0.1 nm/s to 0.2 nm/s. Furthermore, the heating boat including Alq₃ was supplied with an electric current to be heated, and an electron transport layer with a thickness of 40 nm was formed at a deposition rate of 0.1 nm/s to 0.2 nm/s.

Next, the vacuum bath was opened, and a rectangular perforated mask made of stainless steel was installed on the electron transport layer, and on the other hand, magnesium of 3 g was put in the molybdenum resistance heating boat, and silver of 0.5 g was put in a deposition basket made of tungsten. The vacuum bath was decompressed again to 2×10⁻⁴ Pa. Then the boat including magnesium was supplied with an electric current, and magnesium was deposited at a deposition rate of 1.5 nm/s to 0.2 nm/s. At this time, the silver basket was heated simultaneously, and silver was deposited at a deposition rate of 0.1 nm/s. Using a shadow mask in the cathode shape shown in FIG. 4, the cathodes 41 and 42, which are cathodes (200 nm) composed of a mixture of magnesium and silver, having an electrode width of 18 mm and a space of 2 mm between the electrodes are prepared.

Furthermore, the organic EL element was moved to a glove box (glove box replaced with high-purity nitrogen gas of purity of 99.999% or more) in the nitrogen atmosphere without exposing to the air, and the glove box was changed to a seal structure as shown in the schematic block diagram in FIG. 3, thus a light-emitting panel using an organic EL element composed of the light-emitting surfaces S1 to S4 was prepared.

Further, in FIG. 3, as barium oxide 51 which is a desiccant, high-purity powder of barium oxide manufactured by Aldrich Corp. was adhered to a glass sealing can 5 by a fluorine plastic semipermeable membrane with adhesive (Microtex S-NTF8031Q (by Nitto Denko Corp.)) is pre-prepared and used. For adhesion of the sealing can to the organic EL element, the ultraviolet curing adhesive 52 was used and the two were adhered and sealed by irradiating the ultraviolet lamp, thus the light-emitting panel is prepared. When ten light-emitting panels aforementioned were prepared, one panel having a defect of leakage in the area of S1 was prepared, and the others were free of a leaking defect.

Using the light-emitting panel free from a defect and light-emitting panel having a defect in Example 1, in an environment of 23° C., each anode and each cathode were directly driven at a constant current of 0.6 mA/cm² from the same power source to make all the areas emit light simultaneously. When the luminance of the light-emitting surfaces immediately after lighting start was measured at a measuring distance of 94 mm using CS-1000 with a microlens (by Konica Minolta), it has been found that the luminance of the light-emitting panel free from a defect was about 300 cd/m² and that the light-emitting panel having a defect did not emit light at all in all the areas and the luminance was 0 cd/m².

Next, the light-emitting panel free of a defect and light-emitting panel having a defect in Example 1 were driven by time sharing (time sharing drive 1) at a constant current of 2.4 mA/cm² and at 100 Hz to make the areas emit light in the order of S1 to S4. When the luminance of each light-emitting surface was measured by the same method, it has been found that the light-emitting panel free of a defect emitted light at a luminance of about 1200 cd/m². When observed visually from a place at a distance of 40 cm, it was seen to be in almost the same state as that the whole surface emitted light at a luminance of about 300 cd/m². On the other hand, in the light-emitting panel having a defect, the areas of S2 and S3 emitted light at a luminance of about 1200 cd/m² and S1 did not emit light. When observed visually from a place at a distance of 40 cm, it was seen to be in almost the same state as that the whole surface emitted light at a luminance of about 225 cd/m².

Example 2

The photomask for anode preparation was formed in the anode shape as shown in FIG. 8, and the anodes 21 to 24 having an electrode width of 9 mm and a space of 1 mm between the electrodes were prepared, and the shadow mask for cathode preparation was formed in the cathode shape as shown in FIG. 8, and the cathodes 41 to 44 having an electrode width of 9 mm and a space of 1 mm between the electrodes were prepared. For the others, a light-emitting panel using an organic EL element having light-emitting surfaces S1 to S16 were prepared by using the same method to Example 1. When ten light-emitting panels aforementioned were prepared, one panel having a defect of leakage in the area of S3 was prepared, and the others were free from a leaking defect.

Using the light-emitting panel free from a defect and light-emitting panel having a defect in Example 2, in an environment of 23° C., each anode and each cathode were directly driven at a constant current of 0.6 mA/cm² from the same power source to make all the light-emitting surfaces emit light simultaneously. When the luminance of the light-emitting surfaces immediately after lighting start was measured at a measuring distance of 94 mm using CS-1000 with a microlens (by Konica Minolta), it has been found that the luminance of the light-emitting panel free of a defect is about 300 cd/m² and the light-emitting panel having a defect did not emit light at all in all the areas and the luminance is 0 cd/m².

Next, the light-emitting panel free from a defect and light-emitting panel having a defect in Example 2 were driven by time sharing (time sharing drive 1) at a constant current of 12 mA/cm² and at 100 Hz and are permitted to emit light in the order of S1 to S16. When the luminance of each light-emitting surface was measured by the same method, it has been found that the light-emitting panel free of a defect emitted light at a luminance of about 4800 cd/m². When observed visually from a place at a distance of 40 cm, it was seen to be in almost the same state as that the whole surface emits light at a luminance of about 300 cd/m². On the other hand, in the light-emitting panel having a defect, the areas other than S3 emit light at a luminance of about 4800 cd/m² and S3 does not emit light. When observed visually from a place at a distance of 40 cm, it was seen to be in almost the same state as that all the surfaces emit light at a luminance of about 280 cd/m².

Further, the light-emitting panel free from a defect and light-emitting panel having a defect in Example 2 were driven, in the timing chart shown in FIG. 9(A), by time sharing at a constant (time sharing drive 2) current of 2.4 mA/cm² and at 100 Hz to make them emit light in the order of (S1+S3+S9+S11)→(S2+S4+S10+S12)→(S5+S7+S13+S15)→(S6+S8+S14+S16). When the luminance of each light-emitting surface was measured by the same method, it has been found that the light-emitting panel free of a defect emits light at a luminance of about 1200 cd/m². When observed visually from a place at a distance of 40 cm, it was seen to be in almost the same state as that all the surfaces emit light at a luminance of about 300 cd/m². On the other hand, in the light-emitting panel having a defect, all the light-emitting surfaces other than (S1+S3+S9+S11) emitted light at a luminance of about 1200 cd/m² and (S1+S3+S9+S11) did not emit light. When observed visually from a place at a distance of 40 cm, it was seen to be in almost the same state as that all the surfaces emit light at a luminance of about 225 cd/m².

Comparative Example 1

As a photomask for anode preparation, a whole solid surface mask as shown in FIG. 2(A) was used, and as a shadow mask for cathode preparation, a whole solid surface mask as shown in FIG. 2(A) was used. Each electrode width was set to 36 mm. For the others, the same preparation method to Example 1 was used, thus a light-emitting panel using an organic EL element having a light-emitting surface S was prepared. When ten light-emitting panels aforementioned were prepared, one panel having a defect of leakage was prepared, and the others were free from a leaking defect.

Using the light-emitting panel free from a defect and light-emitting panel having a defect in Comparative Example 1 were used, in an environment of 23° C., the anodes and cathodes were directly driven at a constant current of 0.6 mA/cm² from the same power source to make all the light-emitting surfaces emit light. When the luminance of the light-emitting surfaces immediately after lighting start was measured at a measuring distance of 94 mm using CS-1000 with a microlens (by Konica-Minolta), it has been found that the luminance of the light-emitting panel free of a defect was about 300 cd/m² and the light-emitting panel having a defect did not emit light at all in all the areas and the luminance was 0 cd/m².

The evaluation results for Examples 1 and 2 and Comparative Example 1 are summarized in Table 1. In Table 1, the symbol A indicates that the light-emitting panel emitted light. Especially for the time sharing drive 1 and 2 in Table 1, the symbol A also indicates that when observed visually from a place at a predetermined distance, it was seen to be in almost the same state as that all the surfaces of the light-emitting panel emit light. The symbol B indicates that the light-emitting panel did not emit light at all in all the areas.

TABLE 1

| | a: Constant current drive (0.6 mA/cm²) | b: Time sharing drive 1 (light-emitting portions, luminance, current) | c: Time sharing drive 2 (light emitting portions, luminance, current) |
|---|---|---|---|
| Example 1, Normal panel | A | A (4/4, 300 cd/m², 2.4 mA/cm²) | — |
| Example 1, Defective panel | B | A (3/4, 225 cd/m², 2.4 mA/cm²) | — |
| Example 2, Normal panel | A | A (16/16, 300 cd/m², 12 mA/cm²) | A (16/16, 300 cd/m², 2.4 mA/cm²) |
| Example 2, Defective panel | B | A (15/16, 280 cd/m², 12 mA/cm²) | A (12/16, 225 cd/m², 2.4 mA/cm²) |
| Comparative Example, Normal panel | A | — | — |
| Comparative Example, Defective panel | B | — | — |

As indicated above, in the light-emitting panels prepared by the methods of Examples 1 and 2, even if a defect of leakage exists in a light-emitting surface, the whole surface will not be turned off and the function as a light-emitting panel can be maintained.

The invention claimed is:

1. A method for driving a light-emitting panel of a lighting apparatus formed by layering plural first electrodes, one or more organic layers comprising a light-emitting layer, and plural second electrodes on a substrate, wherein a light-emitting surface of the lighting apparatus is divided into at least 16 areas by forming the plural first electrodes and the plural second electrodes so as to intersect each other in a shape of a grid, the method comprising:

making the light-emitting surface of the lighting apparatus emit illumination light by sequentially driving the at least 16 areas by time sharing such that in each divided period of time sharing, a fixed voltage is applied to a predetermined number of areas of the at least 16 areas such that: (i) said predetermined number of areas which are not neighboring to each other are set in an ON-state and emit illumination light at the same time, and (ii) a remainder of the at least 16 areas other than said predetermined number of areas are set in an OFF-state to not emit illumination light.

2. The method for driving the light-emitting panel of claim 1, wherein the predetermined number of areas of the light-emitting surface which are not neighboring to each other are alternate areas on the light-emitting surface.

3. The method for driving the light-emitting panel of claim 1, wherein the at least 16 areas of the light-emitting surface are driven by time sharing such that a quarter of the at least 16 areas emit illumination light for every quarter time period.

4. The method for driving the light-emitting panel of claim 1, wherein a luminance of said illumination light emitted by time sharing by each of the at least 16 areas is configured to be the same.

5. The method for driving the light-emitting panel of claim 1, wherein a frequency of the sequential driving of the at least 16 areas by time sharing is between 1 Hz and 1 kHz.

6. The method for driving the light-emitting panel of claim 1, wherein the lighting apparatus is a backlight of a liquid crystal display.

* * * * *